US012738320B2

(12) United States Patent
Lin

(10) Patent No.: US 12,738,320 B2
(45) Date of Patent: Sep. 15, 2026

(54) CHARGE PUMP CIRCUIT AND CHARGE PUMP DEVICE

(71) Applicant: EMEMORY TECHNOLOGY INC., Hsinchu (TW)

(72) Inventor: Zhe-Yi Lin, Hsinchu County (TW)

(73) Assignee: EMEMORY TECHNOLOGY INC., Hsinchu (TW)

(*) Notice: Subject to any disclaimer, the term of this patent is extended or adjusted under 35 U.S.C. 154(b) by 26 days.

(21) Appl. No.: 19/094,127

(22) Filed: Mar. 28, 2025

(65) Prior Publication Data

US 2025/0323573 A1 Oct. 16, 2025

Related U.S. Application Data

(60) Provisional application No. 63/632,599, filed on Apr. 11, 2024.

(51) Int. Cl.

| | |
|---|---|
| ***H02M 3/07*** | (2006.01) |
| ***G05F 3/26*** | (2006.01) |
| ***G11C 16/04*** | (2006.01) |
| ***G11C 16/10*** | (2006.01) |
| ***G11C 16/14*** | (2006.01) |
| ***G11C 16/34*** | (2006.01) |
| ***H02M 3/00*** | (2006.01) |
| ***H10D 30/00*** | (2025.01) |
| ***H10D 62/10*** | (2025.01) |

(52) U.S. Cl.

CPC ........... *H10D 30/503* (2025.01); *G05F 3/267* (2013.01); *G11C 16/0441* (2013.01); *G11C 16/10* (2013.01); *G11C 16/14* (2013.01); *G11C 16/3436* (2013.01); *H02M 3/003* (2021.05); *H02M 3/07* (2013.01); *H10D 62/121* (2025.01)

(58) Field of Classification Search

None

See application file for complete search history.

(56) References Cited

U.S. PATENT DOCUMENTS

| | | | | |
|---|---|---|---|---|
| 6,819,162 | B2 | 11/2004 | Pelliconi | |
| 12,462,865 | B2 * | 11/2025 | Oh | G11C 11/4074 |
| 12,519,389 | B1 * | 1/2026 | Chen | H02M 1/009 |
| 2008/0042731 | A1 | 2/2008 | Daga et al. | |

OTHER PUBLICATIONS

Office action issued by TIPO dated Nov. 4, 2025 for TW114112016.

* cited by examiner

*Primary Examiner* — Cassandra F Cox

(74) *Attorney, Agent, or Firm* — WPAT, P.C.; Anthony King

(57) ABSTRACT

A charge pump circuit includes a pump unit and an output transistor for outputting a pumped voltage generated by the pump unit. The pump unit includes a first capacitor, a second capacitor, a first transistor, a second transistor, and an auxiliary control unit. The first capacitor receives a first clock signal, and the second capacitor receives a second clock signal having a swing greater than that of the first clock signal. The first transistor has a first terminal coupled to an input terminal, a second terminal coupled to the first capacitor, and a control terminal coupled to the second capacitor. The second transistor has a first terminal coupled to the second capacitor, a second terminal coupled to the second terminal of the first transistor, and a control terminal coupled to the auxiliary control unit, which turns on the second transistor when the first clock signal is high.

17 Claims, 7 Drawing Sheets

CHARGE PUMP CIRCUIT AND CHARGE PUMP DEVICE

CROSS REFERENCE

This application claims the benefit of prior-filed U.S. provisional application No. 63/632,599, filed on Apr. 11, 2024, which is incorporated by reference in its entirety.

TECHNICAL FIELD

The present disclosure relates to a charge pump circuit, and more particularly, to a charge pump circuit suitable for low voltage environment.

DISCUSSION OF THE BACKGROUND

In response to the need for low power consumption in electronic devices, integrated circuits (IC) have been re-designed to operate in low voltage environments. While lower voltages are beneficial for reducing power consumption, there are still situations where greater voltages are necessary. For example, flash memory may require a high voltage (either positive or negative) for performing program operation or erase operation, and such high voltage is typically supplied by a charge pump.

However, to design a charge pump that works in the low voltage environment can be challenging. For example, special care may need to be taken to ensure that the transistors used in the circuit can operate within their safe operating areas (SOA). Also, efficient charge transferring for each stage of the charge pump can be crucial when operating in the low voltage environment.

FIG. 1 shows a traditional Dickson charge pump 90. The charge pump 90 can generate a negative output voltage VO from a zero input voltage V1. The charge pump 90 includes diodes 92A and 92B, and capacitors 94A and 94B. The diodes 92A and 92B are coupled in series between the input terminal and the output terminal. The capacitor 94A is coupled to the diode 92A as a first stage of the charge pump 90, and the capacitor 94B is coupled to the diode 92B as a second stage of the charge pump 90.

To produce the negative output voltage VO, the capacitor 94A receives a clock signal $SIG_{CKA}$, and the capacitor 94B receives a clock signal $SIG_{CKB}$ complementary to the clock signal $SIG_{CKA}$. First, when the clock signal $SIG_{CKA}$ is at a high voltage (e.g., VDD), the voltage V1 at the anode of the diode 92A is charged to a threshold voltage Vt of the diode 92A. Then, when the clock signal $SIG_{CKA}$ drops to a low voltage (e.g., 0V), the voltage V1 will also drop by VDD, that is, the voltage V1 becomes Vt-VDD. Also, when the clock signal $SIG_{CKA}$ changes to the low voltage, the clock signal $SIG_{CKB}$ changes to the high voltage VDD, and a voltage V2 at the anode of the diode 92B is charged to be higher than the voltage V1 by the threshold voltage Vt. That is, the voltage V2 would be 2Vt-VDD. Subsequently, when the clock signal $SIG_{CKB}$ changes to the low voltage, the voltage V2 will drop by the voltage VDD and becomes 2Vt-2VDD.

In other words, each stage of the charge pump 90 can only provide a total voltage drop of VDD-Vt, instead of the full voltage drop VDD provided by the clock signals $SIG_{CKA}$ and $SIG_{CKB}$. Such low efficient charge transferring would lead to the requirement for more number of stages to produce the targeted negative voltage, and the situation can become worse when the charge pump is operated in low voltage environment, where VDD is rather small. Therefore, how to design an efficient charge pump that can operates in the low voltage environment has become an issue to be solved.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a charge pump circuit. The charge pump circuit includes an input terminal, an output terminal, a first pump unit, and an output transistor. The input terminal receives an input voltage, and the output terminal outputs an output voltage. The pump unit includes a first capacitor, a second capacitor, a first transistor, a second transistor, and an auxiliary control unit. The first capacitor has a first terminal configured to receive a first clock signal, and a second terminal. The second capacitor has a first terminal configured to receive a second clock signal, and a second terminal. The first transistor has a first terminal coupled to the input terminal, a second terminal coupled to the second terminal of the first capacitor, and a control terminal coupled to the second terminal of the second capacitor. The second transistor has a first terminal coupled to the second terminal of the second capacitor, a second terminal coupled to the second terminal of the first transistor, and a control terminal. The first auxiliary control unit is coupled to the control terminal of the second transistor. The first auxiliary control unit turns off the second transistor when the first clock signal is at a first high voltage, and turns on the second transistor when the first clock signal is at a low voltage. The first output transistor has a first terminal coupled to the second terminal of the first transistor, a second terminal coupled to the output terminal, and a control terminal. The first clock signal and the second clock signal are in phase, the first clock signal swings between the low voltage and the first high voltage, and the second clock signal swings between the low voltage and a second high voltage higher than the first high voltage. The first output transistor is turned on when the first clock signal is at the low voltage, and is turned off when the first clock signal is at the first high voltage.

One aspect of the present disclosure provides a charge pump device. The charge pump device includes a plurality stages of charge pump circuits, and an input terminal of a latter stage is connected to an output terminal of a previous stage. A first stage of charge pump circuit includes an input terminal, an output terminal, a first pump unit, a second pump unit, and a first output transistor, and a second output transistor. The first pump unit includes a first capacitor, a second capacitor, a first transistor, a second transistor, and a first auxiliary control unit. The first capacitor has a first terminal configured to receive a first clock signal, and a second terminal. The second capacitor has a first terminal configured to receive a second clock signal, and a second terminal. The first transistor has a first terminal coupled to the input terminal, a second terminal coupled to the second terminal of the first capacitor, and a control terminal coupled to the second terminal of the second capacitor. The second transistor has a first terminal coupled to the second terminal of the second capacitor, a second terminal coupled to the second terminal of the first transistor, and a control terminal.

The first auxiliary control unit is coupled to the control terminal of the second transistor. The first auxiliary control unit turns off the second transistor when the first clock signal is at a first high voltage, and turns on the second transistor when the first clock signal is at a low voltage. The second pump unit includes a third capacitor, a fourth capacitor, a third transistor, a fourth transistor, and a second auxiliary control unit. The third capacitor has a first terminal configured to receive a third clock signal, and a second terminal. The fourth capacitor has a first terminal configured to receive a fourth clock signal, and a second terminal. The third transistor has a first terminal coupled to the input terminal, a second terminal coupled to the second terminal of the third capacitor, and a control terminal coupled to the second terminal of the fourth capacitor. The fourth transistor has a first terminal coupled to the second terminal of the fourth capacitor, a second terminal coupled to the second terminal of the third transistor, and a control terminal. The second auxiliary control unit is coupled to the control terminal of the fourth transistor. The second auxiliary control unit turns off the fourth transistor when the third clock signal is at the first high voltage, and turn on the fourth transistor when the third clock signal is at the low voltage. The first output transistor has a first terminal coupled to the second terminal of the first transistor, a second terminal coupled to the output terminal, and a control terminal coupled to a second terminal of the third transistor. The second output transistor has a first terminal coupled to the second terminal of the third transistor, a second terminal coupled to the output terminal, and a control terminal coupled to the second terminal of the first transistor. The first clock signal and the second clock signal are in phase, the first clock signal swings between the low voltage and the first high voltage, and the second clock signal swings between the low voltage and a second high voltage higher than the first high voltage. The first clock signal and the third clock signal are out of phase, and the third clock and the fourth clock signal are in phase. The third clock signal swings between the low voltage and the first high voltage, and the fourth clock signal swings between the low voltage and the second high voltage. The first output transistor is turned on to generate the output voltage according to a voltage at the second terminal of the first transistor when the first clock signal is at the low voltage, and is turned off when the first clock signal is at the first high voltage. The second output transistor is turned on to generate the output voltage according to a voltage at the second terminal of the third transistor when the third clock signal is at the low voltage, and turned off when the third clock signal is at the first high voltage.

BRIEF DESCRIPTION OF THE DRAWINGS

A more complete understanding of the present disclosure may be derived by referring to the detailed description and claims when considered in connection with the Figures, where like reference numbers refer to similar elements throughout the Figures.

DETAILED DESCRIPTION

Figure 1:
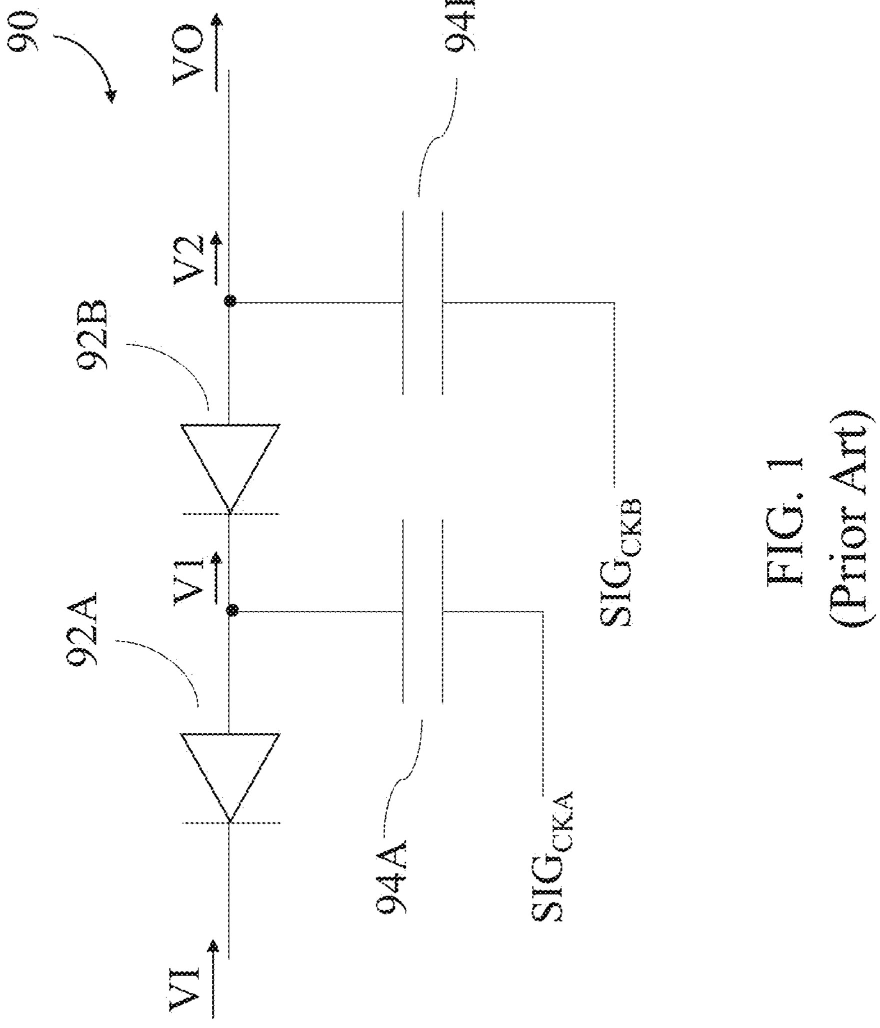
FIG. 1 shows a traditional Dickson charge pump.
Figure 2:
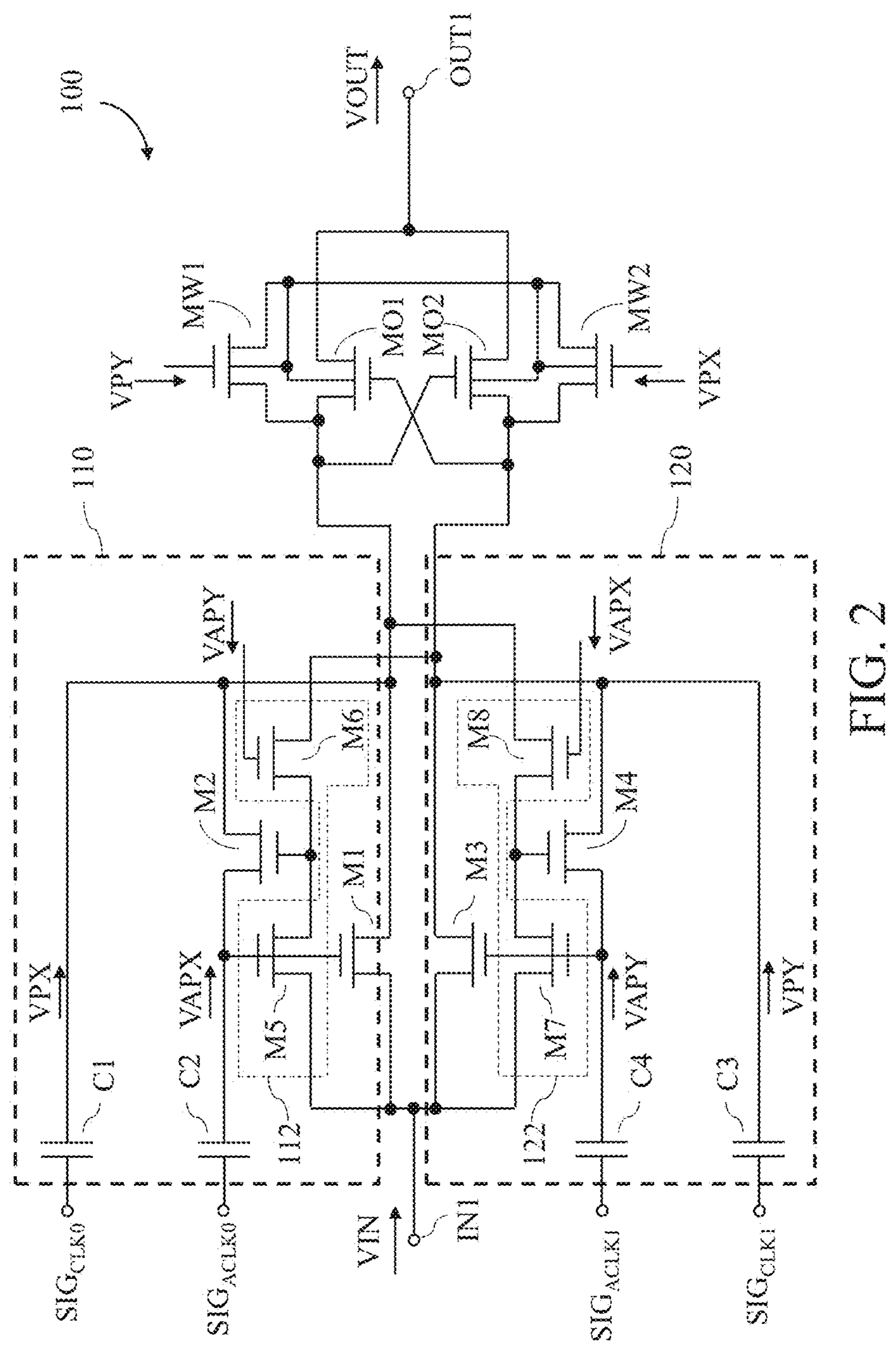
FIG. 2 shows a charge pump circuit according to one embodiment of the present disclosure.

FIG. 2 shows a charge pump circuit 100 according to one embodiment of the present disclosure. The charge pump circuit 100 includes an input terminal IN1, an output terminal OUT1, a pump unit 110, and an output transistor MO1. The input terminal IN1 receives an input voltage VIN, and the output terminal OUT1 outputs a negative output voltage VOUT.

The pump unit 110 can employ two clock signals $SIG_{CLK0}$ and $SIG_{ACLK0}$ to boost the input voltage VIN and generate the negative output voltage VOUT. The clock signals $SIG_{CLK0}$ and $SIG_{ACLK0}$ are in phase, however, the swing of the clock signal $SIG_{ACLK0}$ is greater than the swing of the clock signal $SIG_{CLK0}$. In such case, the pump unit 110 can utilize the clock signal $SIG_{CLK0}$ to boost the voltage and utilize the clock signal $SIG_{ACLK0}$ having a greater swing to control the transistor therein so that the transistor can be fully turned on during the charge transferring. Therefore, the voltage drop provided by the clock signal $SIG_{CLK0}$ can be fully delivered by the charge pump circuit 100 to generate the pumped output voltage VOUT. That is, the charge pump circuit 100 is able to achieve the completed charge transferring, making it suitable for low power application.

As shown in FIG. 2, the pump unit 110 includes a capacitor C1, a capacitor C2, a transistor M1, a transistor M2, and an auxiliary control unit 112. The first capacitor C1 has a first terminal for receiving the clock signal $SIG_{CLK0}$, and a second terminal. The second capacitor C2 has a first terminal for receiving the clock signal $SIG_{ACLK0}$, and a second terminal. The transistor M1 has a first terminal coupled to the input terminal IN1, a second terminal coupled to the second terminal of the capacitor C1, and a control terminal coupled to the second terminal of the capacitor C2. The transistor M2 has a first terminal coupled to the second terminal of the capacitor C2, a second terminal coupled to the second terminal of the transistor M1, and a control terminal. The auxiliary control unit 112 is coupled to the control terminal of the transistor M2. The auxiliary control unit 112 can turn on the transistor M2 when the clock signal $SIG_{CLK0}$ is at a low voltage, and can turn off the transistor M2 when the clock signal $SIG_{CLK0}$ is at a high voltage. The output transistor MO1 has a first terminal coupled to the second terminal of the transistor M1, a second terminal coupled to the output terminal OUT1, and a control terminal. The output transistor MO1 can be turned on when the clock signal $SIG_{CLK0}$ is at the low voltage VL so as to output the output voltage VOUT, and can be turned off when the clock signal $SIG_{CLK0}$ is at the high voltage.

Figure 3:
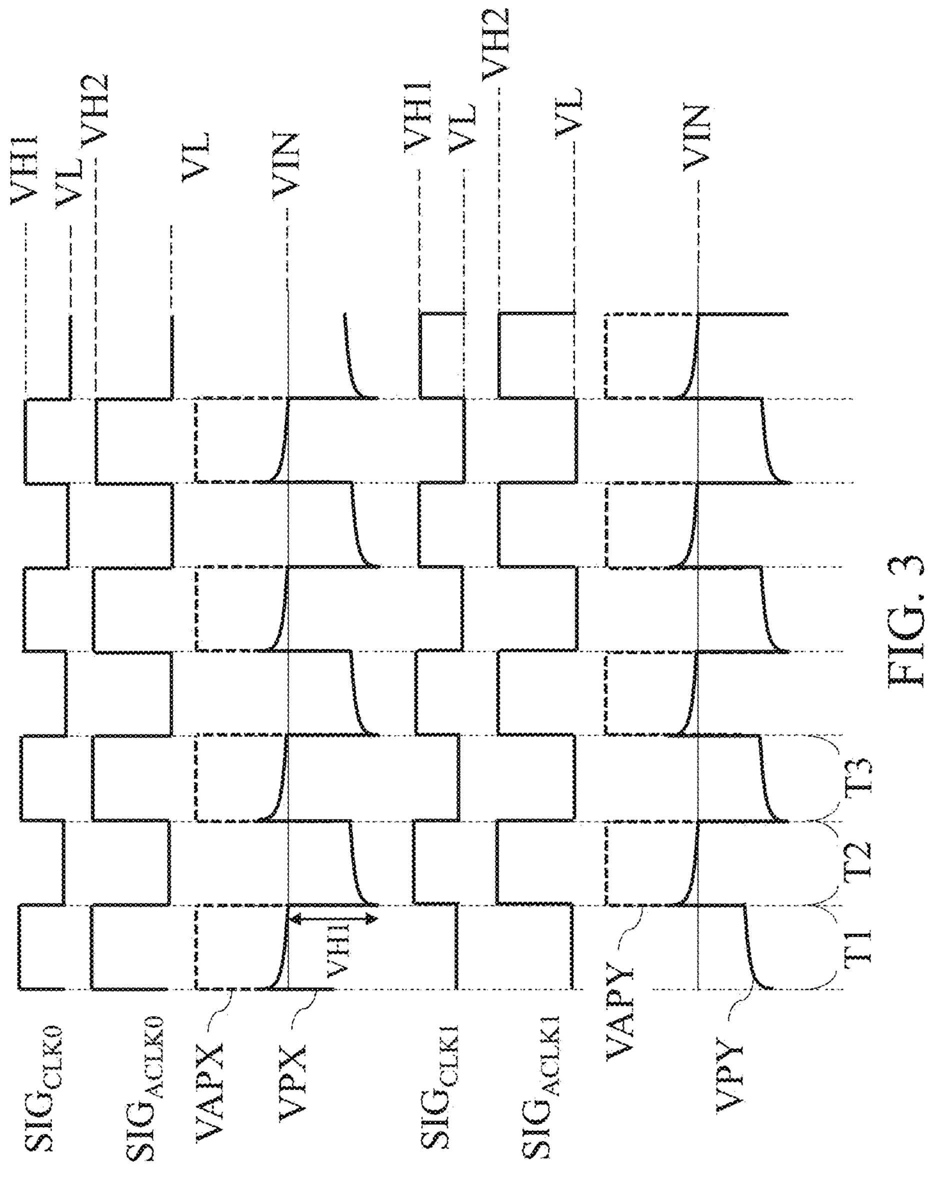
FIG. 3 shows waveforms of voltages and signals of the pump unit in FIG. 2 according to one embodiment of the present disclosure.

FIG. 3 shows waveforms of voltages and signals of the pump unit 110 according to one embodiment of the present disclosure. As shown in FIG. 3, the clock signal $SIG_{CLK0}$ swings between the low voltage VL and the high voltage VH1, and the clock signal $SIG_{ACLK0}$ swings between the low voltage VL and the high voltage VH2 higher than the voltage VH1. In some embodiments, a difference between the voltage VH2 and the voltage VL can be two times a difference between the voltage VH1 and the voltage VL. For example, the voltage VL can be 0V, and the voltage VH2 can be $2 \cdot VH1$. In some embodiments, the voltage VH1 can be the system operational voltage VDD. However, the present disclosure is not limited thereto.

In the period T1 shown in FIG. 3, the clock signal $SIG_{CLK0}$ is at the high voltage VH1, and the clock signal $SIG_{ACLK0}$ is at the high voltage VH2. In such case, the transistor M2 is turned off by the auxiliary control unit 112, and the voltage VAPX at the second terminal of the capacitor C2 is coupled to a high voltage as the clock signal $SIG_{ACLK0}$ raises from the low voltage VL to the high voltage VH2. Therefore, the voltage VAPX can fully turn on the transistor M1. In the present disclosure, since the clock signal $SIG_{ACLK0}$ is used for turning on the transistor M1 for passing the input voltage VIN, the clock signal $SIG_{ACLK0}$ is also referred to a passing clock signal.

As a result, although the voltage VPX at the second terminal of the transistor M1 may also be coupled to a high voltage in the beginning of the period T1 as the clock signal $SIG_{CLK0}$ raises from the low voltage VL to the high voltage VH1, the voltage VPX will be finally pulled down to be same as the input voltage VIN, which can be 0V in the present embodiment. In addition, during the period T1, the output transistor MO1 is turned off, so the voltage VPX will not be outputted to the output terminal OUT1.

Subsequently, in period T2 after the period T1, the clock signals $SIG_{CLK0}$ and $SIG_{ACLK0}$ both change to the low voltage VL. In such case, both the voltages VAPX and VPX will be coupled to a lower voltage through the capacitors C1 and C2 as the clock signals $SIG_{CLK0}$ and $SIG_{ACLK0}$ drop, and thus, the voltages VAPX and VPX will become negative. In addition, since the transistor M2 is turned on by the auxiliary control unit 112 in the period T2, the voltage VAPX and the voltage VPX will drop to the same level. The output transistor MO1 can be turned on to output the negative voltage VPX as the output voltage VOUT. In the present disclosure, since the clock signal $SIG_{CLK0}$ is adopted to boost the voltage VPX to the negative voltage, the clock signal $SIG_{CLK0}$ is also referred to a boosting clock signal.

It may be noticed that in the present embodiment, since the output terminal OUT1 may be coupled to a load, the output voltage VOUT (i.e., the voltage VPX) may be gradually raised due to the load. By proper design, the clock signals $SIG_{CLK0}$ and $SIG_{ACLK0}$ will return to the high voltages VH1 and VH2 respectively before the output voltage VOUT raises to an unacceptable voltage.

Since the pump unit 110 can only output the negative voltage VPX as the output voltage VOUT when the clock signal $SIG_{CLK0}$ is at the low voltage VL at regular intervals, the charge pump circuit 100 may further include another pump unit 120 and another output transistor MO2 to output the negative voltage VOUT when the clock signal $SIG_{CLK0}$ is at the high voltage VH1 so that the charge pump circuit 100 can continuously output the negative output voltage VOUT.

Specifically, the pump unit 120 and the pump unit 110 can have same structures but operate with different groups of clock signals that are complementary to each other, so that the pump unit 110 can generate the negative output voltage VOUT when the boosting clock signal $SIG_{CLK0}$ is at the low voltage VL, and the pump unit 120 can generate the negative output voltage VOUT when the boosting clock signal $SIG_{CLK0}$ is at the high voltage VH1 (i.e., when the boosting clock signal $SIG_{CLK1}$ is at the low voltage VL). The waveforms of the voltages and signals of the pump unit 120 are also shown in FIG. 3 along with the waveforms of the voltages and signals of the pump unit 110.

As shown in FIG. 2, the pump unit 120 includes a capacitor C3, a capacitor C4, a transistor M3, a transistor M4, and an auxiliary control unit 122. The capacitor C3 has a first terminal for receiving a clock signal $SIG_{CLK1}$, and a second terminal. The capacitor C4 has a first terminal for receiving a clock signal $SIG_{ACLK1}$, and a second terminal. The clock signal $SIG_{CLK0}$ and the clock signal $SIG_{CLK1}$ are out of phase, and the clock signal $SIG_{CLK1}$ and the clock signal $SIG_{ACLK1}$ are in phase. In addition, the clock signal $SIG_{CLK1}$ swings between the low voltage VL and the high voltage VH1, and the clock signal $SIG_{ACLK1}$ swings between the low voltage VL and the high voltage VH2. That is, the swing of the passing clock signal $SIG_{ACLK1}$ is greater than the swing of the boosting clock signal $SIG_{CLK1}$.

The transistor M3 has a first terminal coupled to the input terminal IN1, a second terminal coupled to the second terminal of the capacitor C3, and a control terminal coupled to the second terminal of the capacitor C4. The transistor M4 has a first terminal coupled to the second terminal of the capacitor C4, a second terminal coupled to the second terminal of the transistor M3, and a control terminal. The auxiliary control unit 122 is coupled to the control terminal of the transistor M4. The auxiliary control unit 122 can turn off the transistor M4 when the clock signal $SIG_{CLK1}$ is at the high voltage VH1, and turn on the transistor M4 when the clock signal $SIG_{CLK1}$ is at the low voltage.

In some embodiments, the auxiliary control unit 112 includes a transistor M5 and a transistor M6 as shown in FIG. 2. The fifth transistor M5 has a first terminal coupled to the input terminal IN1, a second terminal coupled to the control terminal of the transistor M2, and a control terminal coupled to the second terminal of the capacitor C2. The transistor M6 has a first terminal coupled to the control terminal of the transistor M2, a second terminal coupled to the second terminal of the capacitor C3, and a control terminal coupled to the second terminal of the capacitor C4.

Refer to FIG. 2 and FIG. 3. In the period T1 when the clock signal $SIG_{ACLK0}$ is at the high voltage VH2, the clock signal $SIG_{ACLK1}$ is at the low voltage VL. In such case, the transistor M5 will be turned on by the voltage VAPX that is coupled to a high level, and the transistor M6 can be turned off by the voltage VAPY at the second terminal of the capacitor C4 that is coupled to a low level. Therefore, the control terminal of the transistor M2 would receive the input voltage VIN and would be turned off in the period T1.

In addition, in the period T2 when the clock signal $SIG_{ACLK0}$ is at the low voltage VL, the clock signal $SIG_{ACLK1}$ is at the high voltage VH2. In such case, the transistor M5 will be turned off by the voltage VAPX that is coupled to the low level, and the transistor M6 can be turned on by the voltage VAPY that is coupled to the high level. Therefore, the control terminal of the transistor M2 would receive the voltage VPY at the second terminal of the capacitor C3 that is coupled to a high level, and thus, the transistor M2 would be turned on in the period T2, thereby allowing the voltage VAPX at the second terminal of the capacitor C2 to be same as the voltage VPX at the second terminal of the capacitor C1.

With the transistors M5 and M6, the gate-to-source voltage and the gate-to-drain voltage of the transistor M2 can be kept within its safe operating area (SOA), thereby allowing the transistor M2 to be implemented by a low-voltage transistor having thin oxide.

The auxiliary control unit 122 and the auxiliary control unit 112 have same structures. In the present embodiment, the auxiliary control unit 122 includes a transistor M7 and a transistor M8. The transistor M7 has a first terminal coupled to the input terminal IN1, a second terminal coupled to the control terminal of the transistor M4, and a control terminal coupled to the second terminal of the capacitor C4. The transistor M8 has a first terminal coupled to the control terminal of the transistor M4, a second terminal coupled to the second terminal of the capacitor C1, and a control terminal coupled to the second terminal of the capacitor C2.

Furthermore, the output transistor MO1 has a first terminal coupled to the second terminal of the transistor M1, a second terminal coupled to the output terminal OUT1, and a control terminal coupled to the second terminal of the transistor M3. The output transistor MO2 has a first terminal coupled to the second terminal of the transistor M3, a second terminal coupled to the output terminal, and a control terminal coupled to second terminal of the transistor M3. Therefore, when the clock signal $SIG_{CLK0}$ is at the low voltage and the voltage VPX becomes negative, the output transistor MO1 can be turned on and the output transistor MO2 can be turned off. Consequently, the voltage VPX can be outputted through the output transistor MO1 as the output voltage VOUT. In addition, when the clock signal $SIG_{CLK1}$ is at the low voltage and the voltage VPY becomes negative, the output transistor MO2 can be turned on and the output transistor MO1 can be turned off. Consequently, the voltage VPY can be outputted through the output transistor MO2 as the output voltage VOUT.

In the present embodiment, the charge pump circuit 100 can further include well-select transistors MW1 and MW2 so as to ensure that the body terminals of the output transistors MO1 and MO2 are at the lowest voltage (e.g.—VDD when the input voltage VIN is ground voltage), thereby preventing the cause of current leakage.

As shown in FIG. 2, the well-select transistor MW1 has a first terminal coupled to the first terminal of the output transistor MO1, a second terminal, a control terminal coupled to the second terminal of the capacitor C3 for receiving the voltage VPY, and a body terminal coupled to the second terminal of the well-select transistor MW1. The well-select transistor MW2 has a first terminal coupled to the first terminal of the output transistor MO2, a second terminal coupled to the second terminal of the well-select transistor MW1, a control terminal coupled to the second terminal of the capacitor C1 for receiving the voltage VPX, and a body terminal coupled to the second terminal of the well-select transistor MW2.

As a result, the body terminals of the well-select transistors MW1, MW2 and the body terminals of the output transistors MO1 and MO2 will be tied to the lower one of the voltage VPX and VPY. However, the present disclosure is not limited thereto. In some other embodiments, the body terminals of the output transistors MO1 and MO2 can be coupled to the output terminal OUT1, and the well-select transistors MW1 and MW2 can be omitted.

Figure 4:
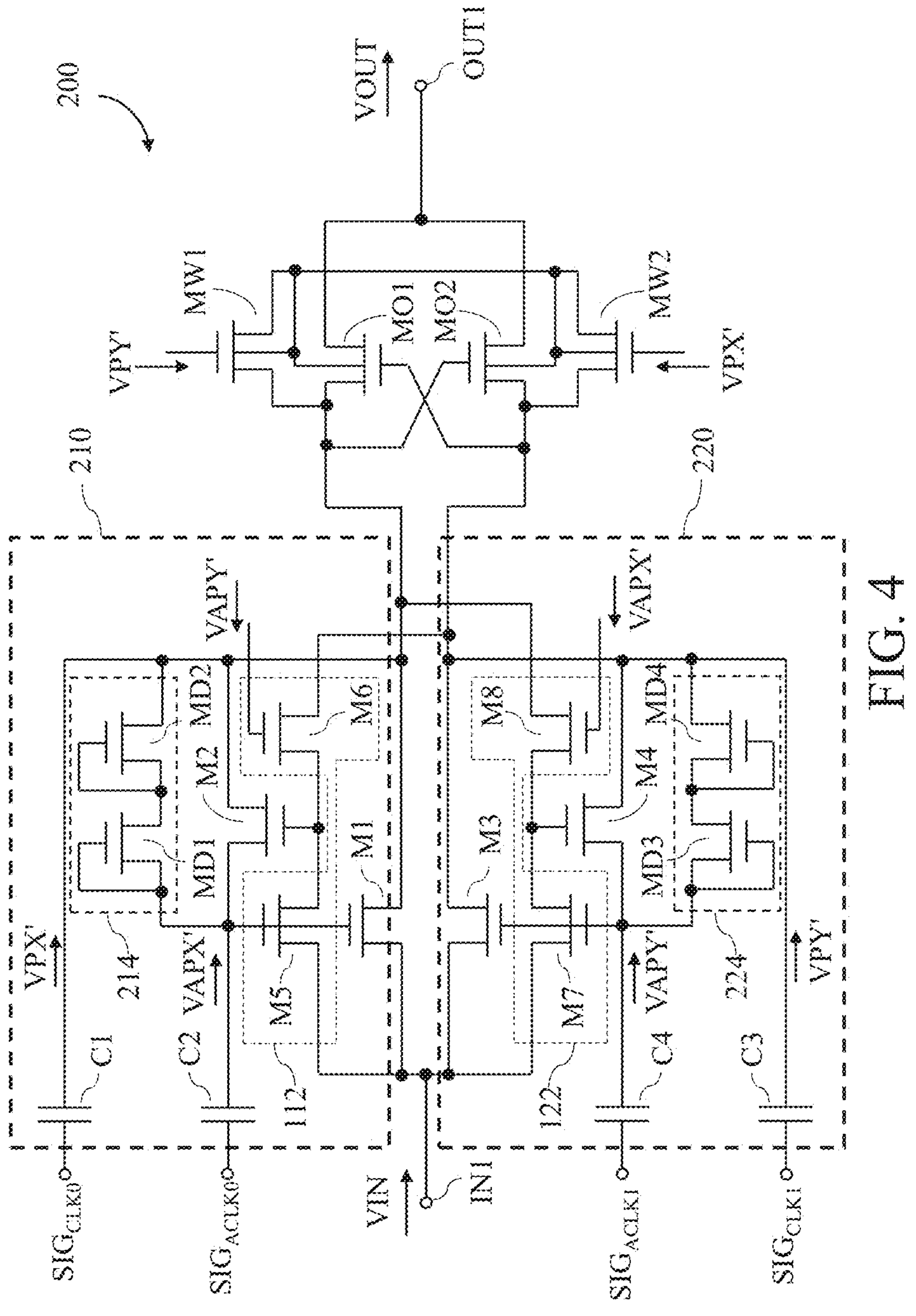
FIG. 4 shows a charge pump circuit according to another embodiment of the present disclosure.

FIG. 4 shows a charge pump circuit 200 according to another embodiment of the present disclosure. The charge pump circuit 200 is different from the charge pump circuit 100 in that the pump unit 210 of the charge pump circuit 200 further includes a voltage gap unit 214 and the pump unit 220 of the charge pump circuit 200 further includes a voltage gap unit 224.

The voltage gap unit 214 is coupled between the second terminal of the capacitor C2 and the second terminal of the transistor M1. The voltage gap unit 214 is configured to let the voltage VAPX' at the second terminal of the capacitor C2 be higher than the voltage VPX' at the second terminal of the transistor M1 by a gap voltage VG when the clock signal $SIG_{CLK0}$ is at the high voltage VH1. The voltage gap unit 224 is coupled between the second terminal of the capacitor C4 and the second terminal of the transistor M3. The voltage gap unit 224 is configured to let the voltage VAPY' at the second terminal of the capacitor C4 be higher than the voltage VPY' at the second terminal of the transistor M3 by the gap voltage VG when the clock signal $SIG_{CLK1}$ is at the high voltage VH1.

Figure 5:
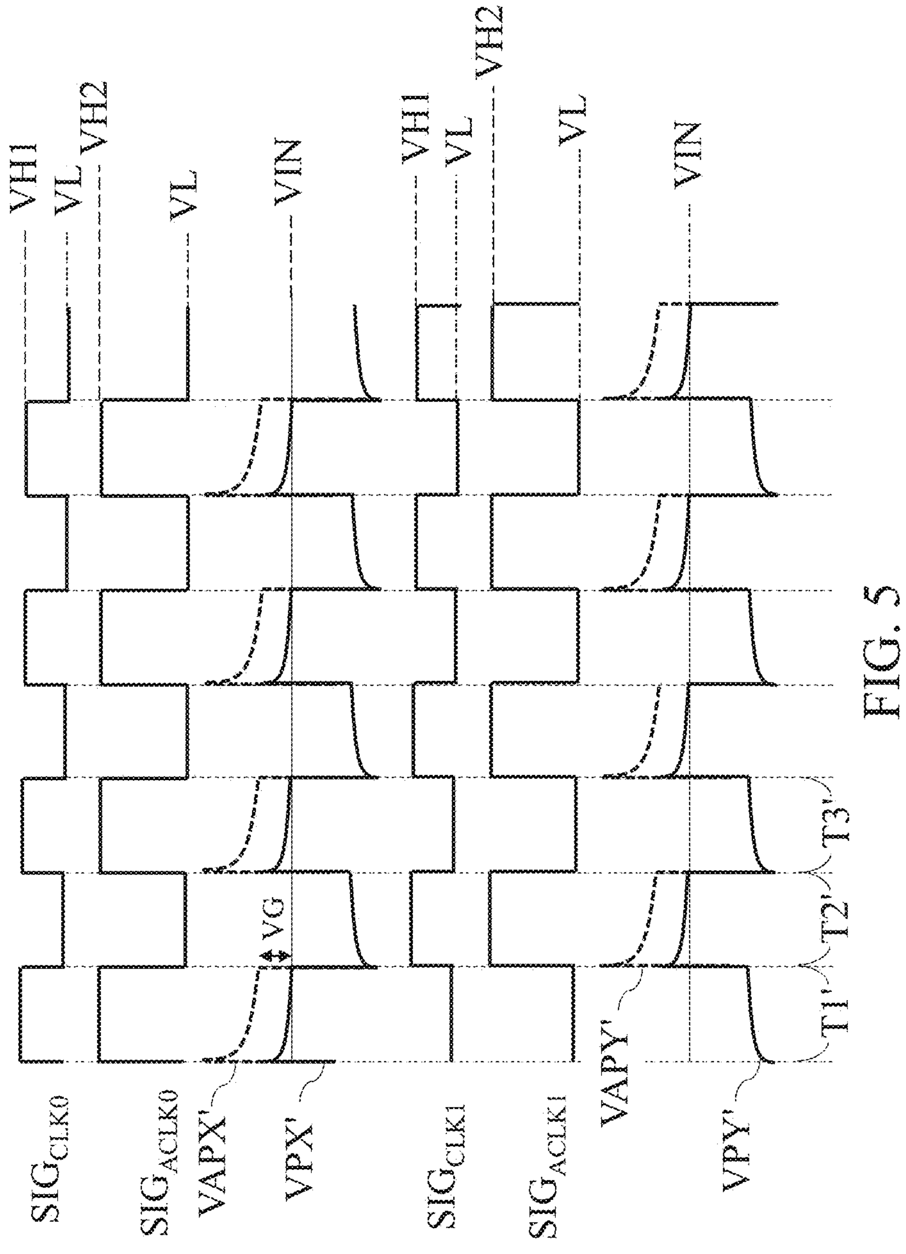
FIG. 5 shows waveforms of voltages and signals of the pump unit in FIG. 4 according to one embodiment of the present disclosure.

FIG. 5 shows waveforms of voltages and signals of the pump unit 210 and the pump unit 220 according to one embodiment of the present disclosure. In the period T1', the clock signal $SIG_{CLK0}$ is at the high voltage VH1, the transistor M2 is turned off. In such case, without the voltage gap unit 214, the voltage VAPX in the period T1 shown in FIG. 3 will maintain at a high level that higher than the voltage VPX by the voltage VH1; however, due to the voltage gap unit 214, the voltage VAPX' in the period T1' shown in FIG. 5 will drop to be higher than the voltage VPX' by the gap voltage VG, where the gap voltage VG is smaller than the voltage VH1. Furthermore, in the present embodiment, the gap voltage VG is greater than a threshold voltage of the transistor M1, so that the voltage VAPX' can still fully turn on the transistor M1.

In the present embodiment, with the aid of the voltage gap unit 214, the voltage VAPX' will be dropped to a lower level in the period T1'; therefore, when the clock signal $SIG_{ACLK0}$ changes from the high voltage VH2 to the low voltage VL in the period T2', the voltage VAPX' would be expected to be dropped to a level lower than the voltage VPX' (the voltage VAPX' is expected to be dropped by the voltage VH2 while the voltage VPX' is expected to be dropped by the voltage VH1, and the voltage VAPX' and the voltage VPX' will finally be at the same level due to the turned-on transistor M2), and such pull-down driving force can help the voltage VPX' to reach the targeted negative voltage level even sooner as the transistor M2 is turned on during the period T2'.

Similarly, the voltage gap unit 224 can have the voltage VAPY' dropped to a lower level in the period T2'. Therefore, when the clock signal $SIG_{ACLK1}$ changes from the high voltage VH2 to the low voltage VL in the period T3', the voltage VAPY' would be expected to be dropped to a level lower than the voltage VPY', thereby assisting the voltage VPY' to reach the targeted negative voltage level sooner.

In some embodiments, each of the voltage gap units 214 and 224 may include at least one diode or at least one diode-connected transistor for providing the gap voltage VG. As shown in FIG. 4, the voltage gap unit 214 includes diode-connected transistors MD1 and MD2. The diode-connected transistor MD1 has a first terminal coupled to the second terminal of the capacitor C2, a second terminal, and a control terminal coupled to the first terminal of the diode-connected transistor MD1. The diode-connected transistor MD2 has a first terminal coupled to the second terminal of the diode-connected transistor MD1, a second terminal coupled to the second terminal of the transistor M1, and a control terminal coupled to the first terminal of the diode-connected transistor MD2.

In such case, the gap voltage VG provided by the gap voltage unit 214 would be equal to the sum of the threshold voltages of the diode-connected transistors MD1 and MD2. In the present embodiment, the threshold voltages of the diode-connected transistors MD1 and MD2 can be same as the threshold voltage of the transistor M1, in other words, it makes the design much easier that the transistors M1, MD1 and MD2 can be the same device. Therefore, in the end of the time period T1', the voltage VAPX' will still be higher than the voltage VPX' by two times the threshold voltage, thereby ensuring the transistor M1 can be fully turned on. In addition, in the present embodiment, the diode-connected transistors MD1 and MD2 can also help to ensure that the drain-to-source voltage of the transistor M2 remains within its SOA.

In the present embodiment, the gap voltage unit 224 can have the same structure as the gap voltage unit 214. That is, the gap voltage unit 224 can also adopt two diode-connected transistors MD3 and MD4 coupled in series. However, in some embodiments, the transistors MD1, MD2, MD3, and MD4 can be replaced by diodes.

Furthermore, unlike the transistors M1 and M3 and the output transistors MO1 and MO2 that are used to output the output voltage VOUT with higher currents, the rest of transistors M2, M4, M5, M6, M7, M8 the well-select transistors MW1, MW2, and the diode-connected transistors MD1, MD2, MD3, and MD4 are used to adjust the voltages with lower currents. Therefore, in some embodiments, the effective channel widths of the transistors M1 and M3 and the output transistors MO1 and MO2 can be greater than the effective channel widths of the transistors M2, M4, M5, M6, M7, M8, the well-select transistors MW1, MW2, and the diode-connected transistors MD1, MD2, MD3, and MD4. The transistors M2, M4, M5, M6, M7, M8, MW1, MW2, MD1, MD2, MD3, and MD4 with smaller effective channel width reduce the total area of the charge pump.

In some embodiments, the transistors M1 to M8, the output transistors MO1, MO2, the well-select transistors MW1, MW2, and the diode-connected transistors MD1, MD2, MD3, and MD4 are N-type transistors. Furthermore, since all transistors in the charge pump circuits 100 and 200 can operate with the gate-to-drain voltage, the gate-to-source voltage, and the drain-to-source voltage being smaller than or equal to the system operational voltage VDD, all transistors in the charge pump circuits 100 and 200 can be implemented by low-voltage transistors that have thin gate oxides.

Figure 6:
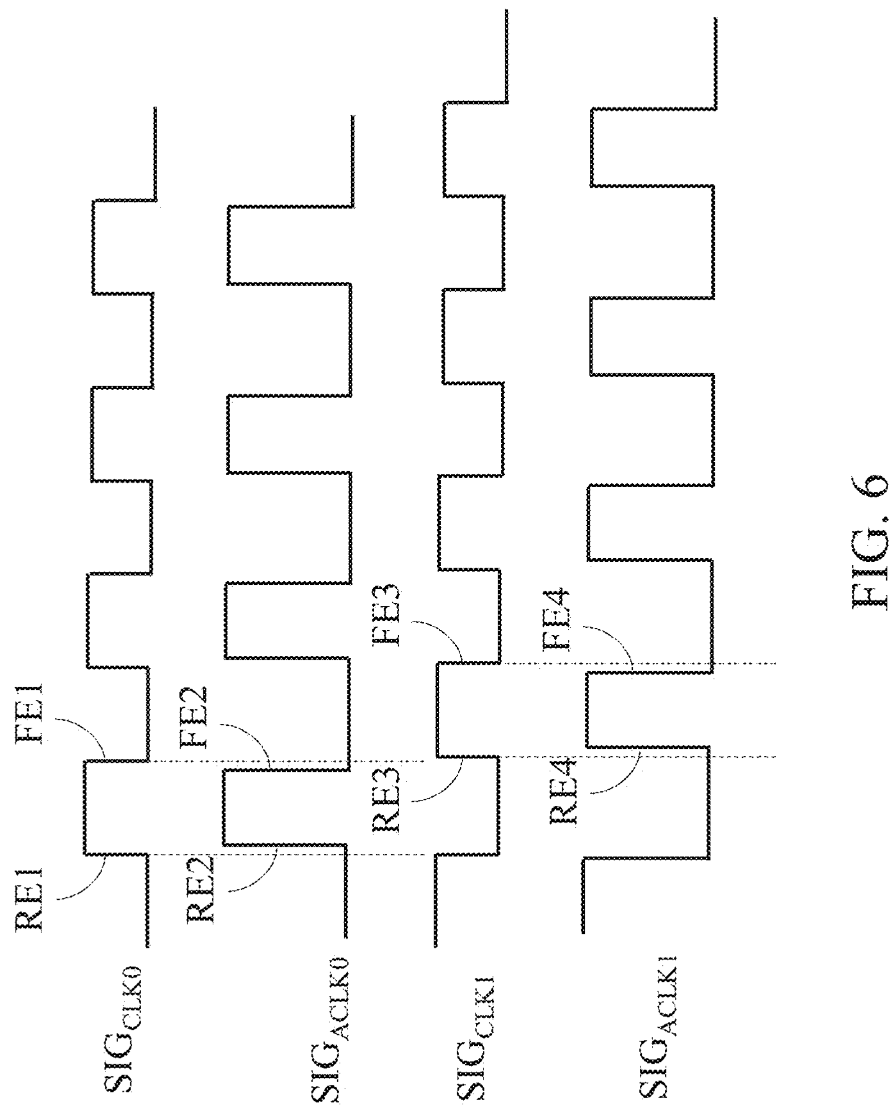
FIG. 6 shows waveforms of the clock signals according to one embodiment of the present disclosure.

In addition, in some embodiment, to improve the efficiency of the charge pump circuit 100 or 200, the time window that the clock signal $SIG_{CLK0}$ be at the high voltage VH1 may enclose the time window that the clock signal $SIG_{ACLK0}$ be at the high voltage VH2, and the time window that the clock signal $SIG_{CLK1}$ be at the high voltage VH1 may enclose the time window that the clock signal $SIG_{ACLK1}$ be at the high voltage VH2. FIG. 6 shows waveforms of the clock signals $SIG_{CLK0}$, $SIG_{ACLK0}$, $SIG_{CLK1}$, and $SIG_{ACLK1}$ according to one embodiment of the present disclosure. As shown in FIG. 6, a rising edge RE1 of the clock signal $SIG_{CLK0}$ leads a rising edge RE2 of the clock signal $SIG_{ACLK0}$, and a falling edge FE1 of the clock signal $SIG_{CLK0}$ lags a falling edge FE2 of the clock signal $SIG_{ACLK0}$. Similarly, a rising edge RE3 of the clock signal $SIG_{CLK1}$ leads a rising edge RE4 of the clock signal $SIG_{ACLK1}$, and a falling edge FE3 of the clock signal $SIG_{CLK1}$ lags a falling edge FE4 of the clock signal $SIG_{ACLK1}$.

Figure 7:
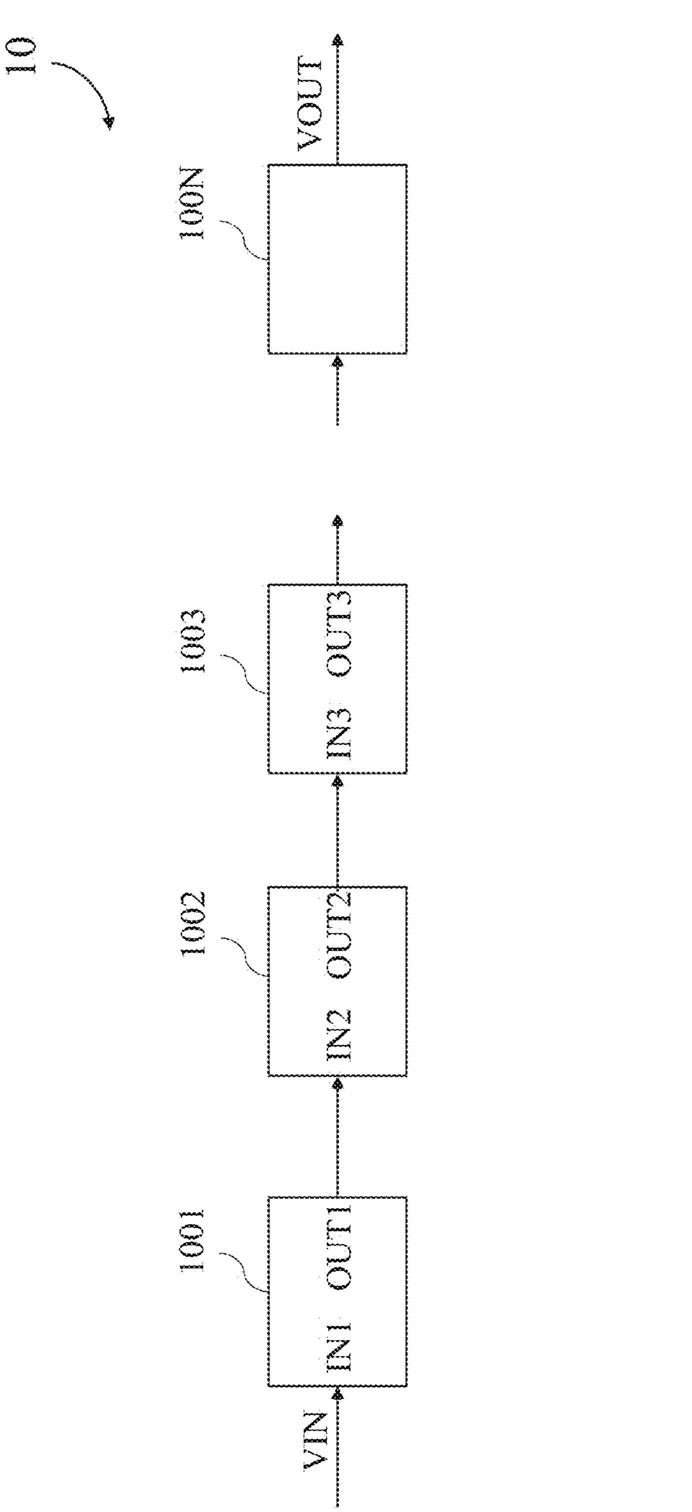
FIG. 7 shows a charge pump device according to one embodiment of the present disclosure.

In some embodiments, the charge pump circuits 100 and 200 can be cascaded to generate a negative output voltage at even lower level. FIG. 7 shows a charge pump device 10 according to one embodiment of the present disclosure. The charge pump device 10 includes a plurality stages of charge pump circuits 1001 to 100N.

In the present embodiment, each stage of the charge pump circuits 1001 to 100N can be implemented by the charge pump circuit 100 shown in FIG. 2 or the charge pump circuit 200 shown in FIG. 4. In the present embodiment, an input terminal IN1 of the charge pump circuit 1001 may receive the input voltage VIN, an output terminal OUT1 of the charge pump circuit 1001 is coupled to an input terminal IN2 of the charge pump circuit 1002, an output terminal OUT2 of the charge pump circuit 1002 is coupled to an input terminal IN3 of the charge pump circuit 1003, and so on. Finally, the charge pump circuit 100N can output the output voltage VOUT. In the present embodiment, with the aid of the passing clock signals $SIG_{ACLK0}$ and $SIG_{ACLK1}$ having greater swing amplitudes, each stage of the charge pump device 10 (i.e., each of the charge pump circuits 1001 to 100N) is able to contribute a full voltage drop of VH1 provided by the boosting clock signals $SIG_{CLK0}$ and $SIG_{CLK1}$. In other words, compared to the traditional charge pump 90, the charge pump device 10 can achieve better efficiency in terms of charge transferring in each stage.

In summary, the charge pump circuits and the charge pump devices provided by the embodiments of the present disclosure can adopt boosting clock signals and passing clock signals of two phases, so that the voltage drop contributed by each stage can be the full voltage drop provided by the boosting clock signals. That is, the charge pump circuits and the charge pump devices of the present disclosure can achieve better efficiency in terms of charge transferring, so that the charge pump circuits is particularly suitable for low power design. Furthermore, the charge pump circuits and the charge pump devices provided by the embodiments of the present disclosure can use the voltage drop of the passing clock signals to assist the boosting of the output voltage, so as to further improve the efficiency of the charge pump circuits and the charge pump devices.

What is claimed is:

1. A charge pump circuit comprising:
an input terminal configured to receive an input voltage;
an output terminal configured to output an output voltage;
a first pump unit comprising:
a first capacitor having a first terminal configured to receive a first clock signal, and a second terminal;
a second capacitor having a first terminal configured to receive a second clock signal, and a second terminal;
a first transistor having a first terminal coupled to the input terminal, a second terminal coupled to the second terminal of the first capacitor, and a control terminal coupled to the second terminal of the second capacitor;
a second transistor having a first terminal coupled to the second terminal of the second capacitor, a second terminal coupled to the second terminal of the first transistor, and a control terminal; and
a first auxiliary control unit coupled to the control terminal of the second transistor, and configured to turn off the second transistor when the first clock signal is at a first high voltage, and turn on the second transistor when the first clock signal is at a low voltage; and
a first output transistor having a first terminal coupled to the second terminal of the first transistor, a second terminal coupled to the output terminal, and a control terminal;
wherein the first clock signal and the second clock signal are in phase, the first clock signal swings between the low voltage and the first high voltage, and the second clock signal swings between the low voltage and a second high voltage higher than the first high voltage;
wherein the first output transistor is configured to be turned on when the first clock signal is at the low voltage, and turned off when the first clock signal is at the first high voltage.

2. The charge pump circuit of claim 1, wherein a difference between the second high voltage and the low voltage is two times a difference between the first high voltage and the low voltage.

3. The charge pump circuit of claim 1, further comprises:

a second pump unit comprising:

a third capacitor having a first terminal configured to receive a third clock signal, and a second terminal;

a fourth capacitor having a first terminal configured to receive a fourth clock signal, and a second terminal;

a third transistor having a first terminal coupled to the input terminal, a second terminal coupled to the second terminal of the third capacitor and the control terminal of the first output transistor, and a control terminal coupled to the second terminal of the fourth capacitor;

a fourth transistor having a first terminal coupled to the second terminal of the fourth capacitor, a second terminal coupled to the second terminal of the third transistor, and a control terminal; and a second auxiliary control unit coupled to the control terminal of the fourth transistor, and configured to turn off the fourth transistor when the third clock signal is at the first high voltage, and turn on the fourth transistor when the third clock signal is at the low voltage; and a second output transistor having a first terminal coupled to the second terminal of the third transistor, a second terminal coupled to the output terminal, and a control terminal coupled to the second terminal of the first transistor;

wherein the first clock signal and the third clock signal are out of phase, and the third clock and the fourth clock signal are in phase;

wherein the third clock signal swings between the low voltage and the first high voltage, and the fourth clock signal swings between the low voltage and the second high voltage;

wherein when the first output transistor is turned on, the first output transistor generates the output voltage according to a voltage at the second terminal of the first transistor; and wherein the second output transistor is configured to be turned on to generate the output voltage according to a voltage at the second terminal of the third transistor when the third clock signal is at the low voltage, and turned off when the third clock signal is at the first high voltage.

4. The charge pump circuit of claim 3, wherein the first auxiliary control unit comprises:

a fifth transistor having a first terminal coupled to the input terminal, a second terminal coupled to the control terminal of the second transistor, and a control terminal coupled to the second terminal of the second capacitor; and a sixth transistor having a first terminal coupled to the control terminal of the second transistor, a second terminal coupled to the second terminal of the third capacitor, and a control terminal coupled to the second terminal of the fourth capacitor.

5. The charge pump circuit of claim 4, wherein the second auxiliary control unit comprises:

a seventh transistor having a first terminal coupled to the input terminal, a second terminal coupled to the control terminal of the fourth transistor, and a control terminal coupled to the second terminal of the fourth capacitor; and an eighth transistor having a first terminal coupled to the control terminal of the fourth transistor, a second terminal coupled to the second terminal of the first capacitor, and a control terminal coupled to the second terminal of the second capacitor.

6. The charge pump circuit of claim 3, wherein a body terminal of the first output transistor and a body terminal of the second output transistor are coupled to the output terminal.

7. The charge pump circuit of claim 3, further comprising:

a first well-select transistor having a first terminal coupled to the first terminal of the first output transistor, a second terminal, a control terminal coupled to the second terminal of the third capacitor, and a body terminal coupled to the second terminal of the first well-select transistor and a body terminal of the first output transistor; and a second well-select transistor having a first terminal coupled to the first terminal of the second output transistor, a second terminal coupled to the second terminal of the first well-select transistor, a control terminal coupled to the second terminal of the first capacitor, and a body terminal coupled to the second terminal of the second well-select transistor and a body terminal of the second output transistor.

8. The charge pump circuit of claim 1, wherein the first transistor and the second transistor are N-type transistors, and when the input voltage is a ground voltage, the output voltage is less than the ground voltage.

9. The charge pump circuit of claim 1, wherein the first pump unit further comprises a voltage gap unit coupled between the second terminal of the second capacitor and the second terminal of the first transistor, and configured to let a voltage at the second terminal of the second capacitor be higher than a voltage at the second terminal of the first transistor by a gap voltage when the first clock signal is at the first high voltage, wherein the gap voltage is greater than a threshold voltage of the first transistor.

10. The charge pump circuit of claim 9, wherein the voltage gap unit comprises at least one diode or at least one diode-connected transistor.

11. The charge pump circuit of claim 9, wherein the voltage gap unit comprises:

a first diode-connected transistor having a first terminal coupled to the second terminal of the second capacitor, a second terminal, and a control terminal coupled to the first terminal of the first diode-connected transistor; and a second diode-connected transistor having a first terminal coupled to the second terminal of the first diode-connected transistor, a second terminal coupled to the second terminal of the first transistor, and a control terminal coupled to the first terminal of the second diode-connected transistor.

12. The charge pump circuit of claim 11, wherein a threshold voltage of the first diode-connected transistor, a threshold voltage of the second diode-connected transistor, and a threshold voltage of the first transistor are equal.

13. The charge pump circuit of claim 11, wherein an effective channel width of the first transistor is greater than an effective channel width of the first diode-connected transistor.

14. The charge pump circuit of claim 1, wherein a size of the first transistor is greater than a size of the second transistor and each size of transistors in the first auxiliary control unit.

15. The charge pump circuit of claim 1, wherein a rising edge of the first clock signal leads a rising edge of the second clock signal, and a falling edge of the first clock signal lags a falling edge of the second clock signal.

16. A charge pump device comprising:

a plurality stages of charge pump circuit, and an input terminal of a latter stage being connected to an output terminal of a previous stage:

wherein a first stage of charge pump circuit comprises:

an input terminal;

an output terminal;

a first pump unit comprising:

a first capacitor having a first terminal configured to receive a first clock signal, and a second terminal;

a second capacitor having a first terminal configured to receive a second clock signal, and a second terminal;

a first transistor having a first terminal coupled to the input terminal, a second terminal coupled to the second terminal of the first capacitor, and a control terminal coupled to the second terminal of the second capacitor;

a second transistor having a first terminal coupled to the second terminal of the second capacitor, a second terminal coupled to the second terminal of the first transistor, and a control terminal; and a first auxiliary control unit coupled to the control terminal of the second transistor, and configured to turn off the second transistor when the first clock signal is at a first high voltage, and turn on the second transistor when the first clock signal is at a low voltage;

a second pump unit comprising:

a third capacitor having a first terminal configured to receive a third clock signal, and a second terminal;

a fourth capacitor having a first terminal configured to receive a fourth clock signal, and a second terminal;

a third transistor having a first terminal coupled to the input terminal, a second terminal coupled to the second terminal of the third capacitor, and a control terminal coupled to the second terminal of the fourth capacitor;

a fourth transistor having a first terminal coupled to the second terminal of the fourth capacitor, a second terminal coupled to the second terminal of the third transistor, and a control terminal; and a second auxiliary control unit coupled to the control terminal of the fourth transistor, and configured to turn off the fourth transistor when the third clock signal is at the first high voltage, and turn on the fourth transistor when the third clock signal is at the low voltage;

a first output transistor having a first terminal coupled to the second terminal of the first transistor, a second terminal coupled to the output terminal, and a control terminal coupled to the second terminal of the third transistor;

a second output transistor having a first terminal coupled to the second terminal of the third transistor, a second terminal coupled to the output terminal, and a control terminal coupled to the second terminal of the first transistor;

wherein the first clock signal and the second clock signal are in phase, the first clock signal swings between the low voltage and the first high voltage, and the second clock signal swings between the low voltage and a second high voltage higher than the first high voltage;

wherein the first clock signal and the third clock signal are out of phase, and the third clock and the fourth clock signal are in phase;

wherein the third clock signal swings between the low voltage and the first high voltage, and the fourth clock signal swings between the low voltage and the second high voltage;

wherein the first output transistor is configured to be turned on to generate an output voltage according to a voltage at the second terminal of the first transistor when the first clock signal is at the low voltage, and turned off when the first clock signal is at the first high voltage; and wherein the second output transistor is configured to be turned on to generate the output voltage according to a voltage at the second terminal of the third transistor when the third clock signal is at the low voltage, and turned off when the third clock signal is at the first high voltage.

17. The charge pump device of claim 16, wherein an output terminal of the first stage of charge pump circuit is coupled to an input terminal of a second stage of charge pump circuit of the plurality stages of charge pump circuits.

* * * * *